United States Patent
Law et al.

(10) Patent No.: US 8,286,929 B2
(45) Date of Patent: Oct. 16, 2012

(54) CLAM SHELL TWO-PIN WAFER HOLDER FOR METAL PLATING

(75) Inventors: Kennith Ray Law, Fresno, TX (US); Rodney Allen Biskeborn, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 312 days.

(21) Appl. No.: 12/415,388

(22) Filed: Mar. 31, 2009

(65) Prior Publication Data

US 2009/0245983 A1  Oct. 1, 2009

Related U.S. Application Data

(60) Provisional application No. 61/041,351, filed on Apr. 1, 2008.

(51) Int. Cl.
*A47B 91/00* (2006.01)

(52) U.S. Cl. .............. 248/346.01; 204/297.01; 118/500; 248/349.1

(58) Field of Classification Search ............ 248/346.01, 248/349.1; 206/832, 308.1; 414/935; 220/324, 220/315, 810; 118/500, 503; 269/21, 903; 204/285, 286, 287, 288, 288.6
See application file for complete search history.

(56) References Cited

U.S. PATENT DOCUMENTS

| | | | | |
|---|---|---|---|---|
| 7,022,211 | B2* | 4/2006 | Yoshioka et al. | 204/297.01 |
| 7,431,260 | B2* | 10/2008 | Lin | 248/542 |
| 2005/0025466 | A1* | 2/2005 | Yen et al. | 386/125 |
| 2005/0268314 | A1* | 12/2005 | Dai | 720/657 |
| 2006/0026613 | A1* | 2/2006 | Mao et al. | 720/655 |
| 2006/0277558 | A1* | 12/2006 | Wang et al. | 720/657 |
| 2007/0051191 | A1* | 3/2007 | Lin | 73/865.8 |
| 2007/0284270 | A1* | 12/2007 | Huang | 206/308.1 |

* cited by examiner

*Primary Examiner* — A. Joseph Wujciak, III
(74) *Attorney, Agent, or Firm* — Jacqueline J. Garner; Wade J. Brady, III; Frederick J. Telecky, Jr.

(57) ABSTRACT

A clam shell wafer holder includes a base and a lid pivotally connected with the base by an integral hinge. The base includes a rotatable wafer support, and the lid includes a universal frame and a pin holder attachment spaced inwardly from the frame. Only two contact pins are formed in a wafer-facing surface of the pin holder attachment. The contact pins are manually aligned with and contact two points on a wafer when the lid is closed against the base. A method for holding a wafer for plating is provided using the disclosed holder apparatus.

19 Claims, 8 Drawing Sheets

CLAM SHELL TWO-PIN WAFER HOLDER FOR METAL PLATING

FIELD

This application claims priority from U.S. Provisional Patent Application Ser. No. 61/041,351, filed Apr. 1, 2008, which is hereby incorporated by reference in its entirety This invention relates generally to a wafer holder and more particularly to a wafer holder of the type that delivers electrical current to the wafer during a metal plating process, the clam shell two-pin wafer holder having a reduced number of wafer contact pins than known holder designs.

BACKGROUND

In integrated circuit fabrication, it is often desirable to plate metal onto the surface of a wafer. The plated metal provides assembly sites on the wafer with a "bump" pad for wire bonding. Plating of wafers is done at a known plating hood in which Cu, Ni, or Pd can be used to plate wafers. Within the hood, the wafer is held by a holder during the plating process. The holder assists in the plating process by supporting the wafer and providing metal pins in contact with a copper seed metal surface of the wafer such that a current is applied to the wafer via the metal pins during the plating process.

Figure 1A:
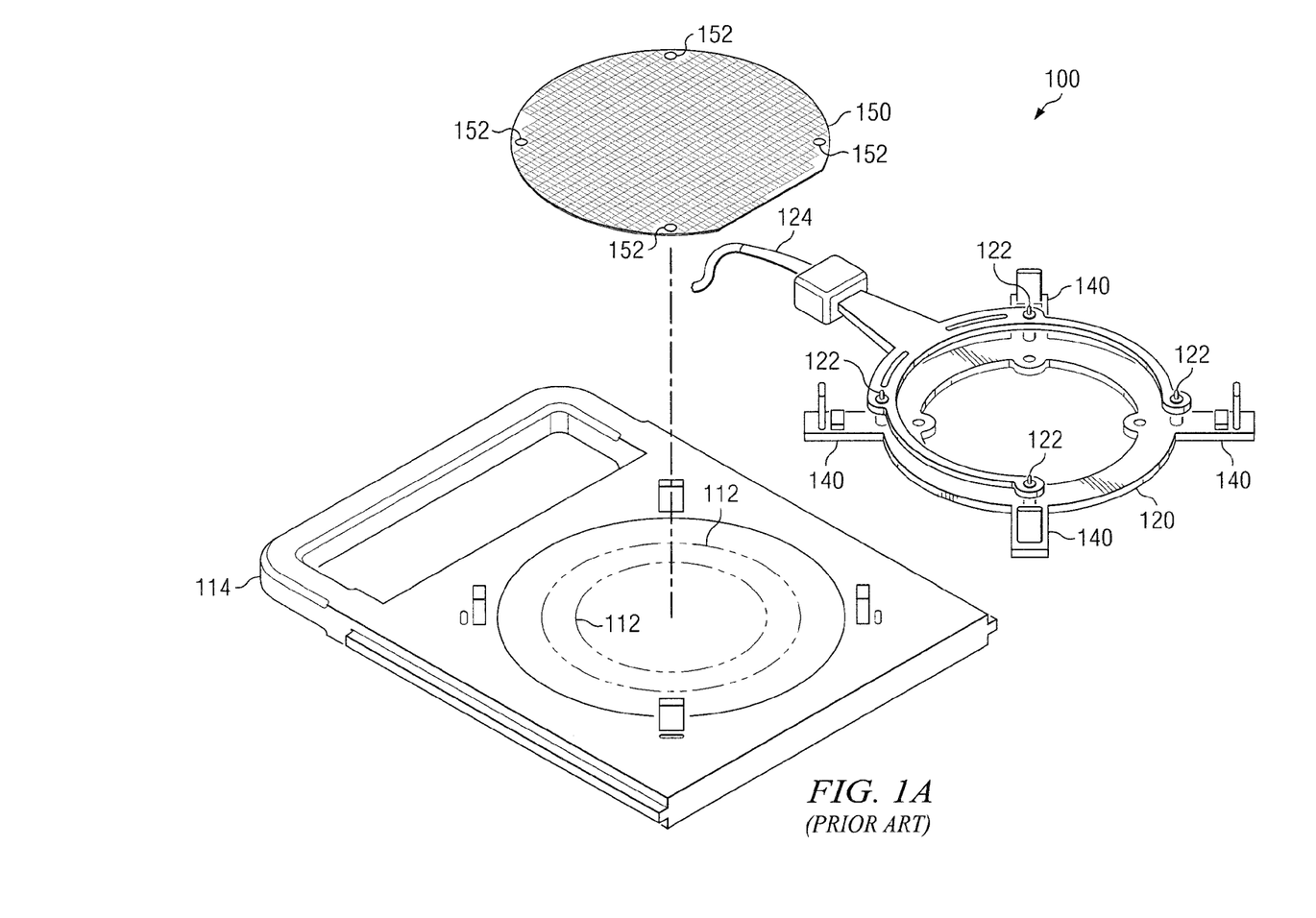
FIG. 1A is a perspective diagram of a known wafer holder in an open position.
Figure 1B:
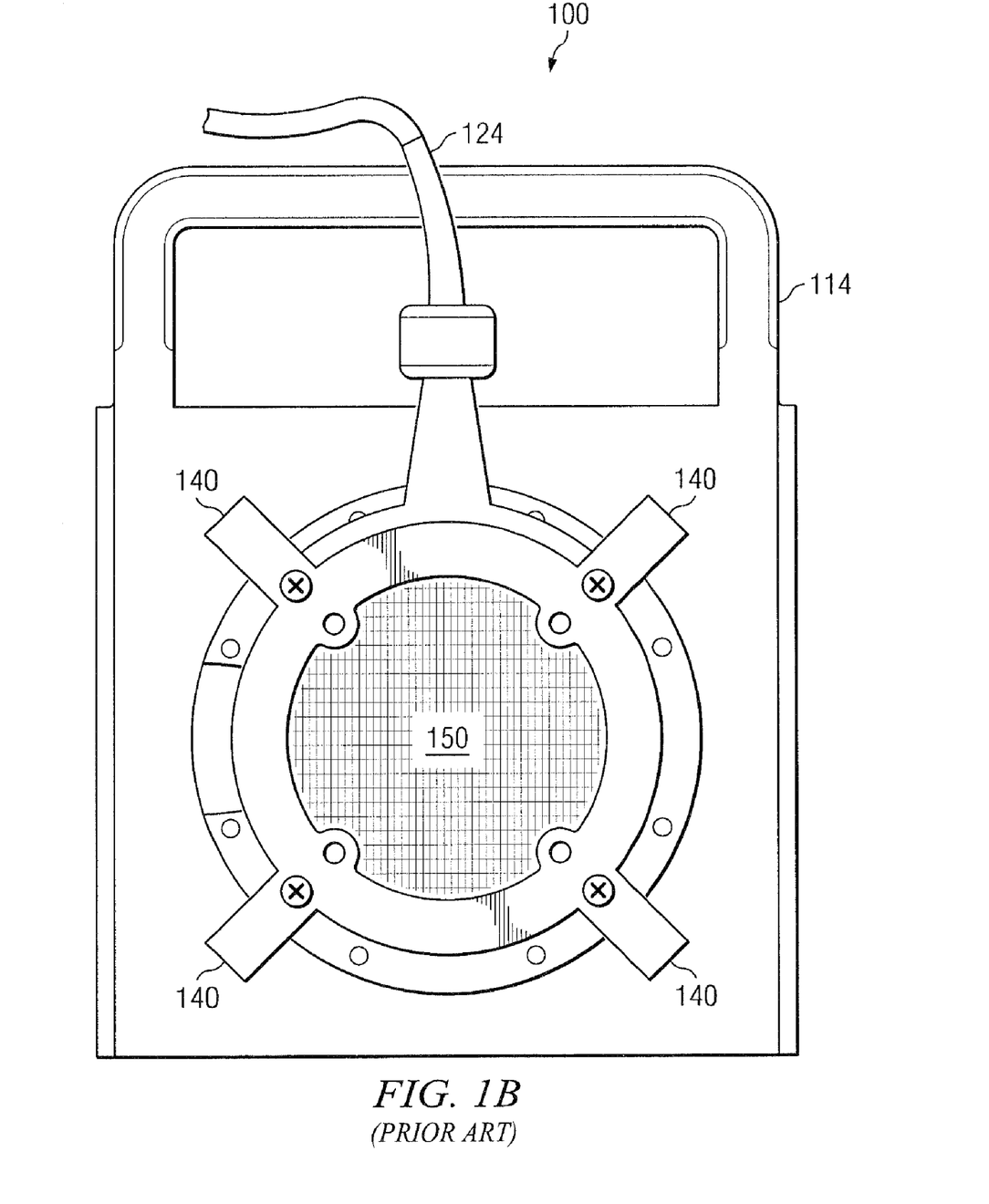
FIG. 1B is a perspective diagram of the wafer holder of FIG. 1A in a closed position.
Figure 2A:
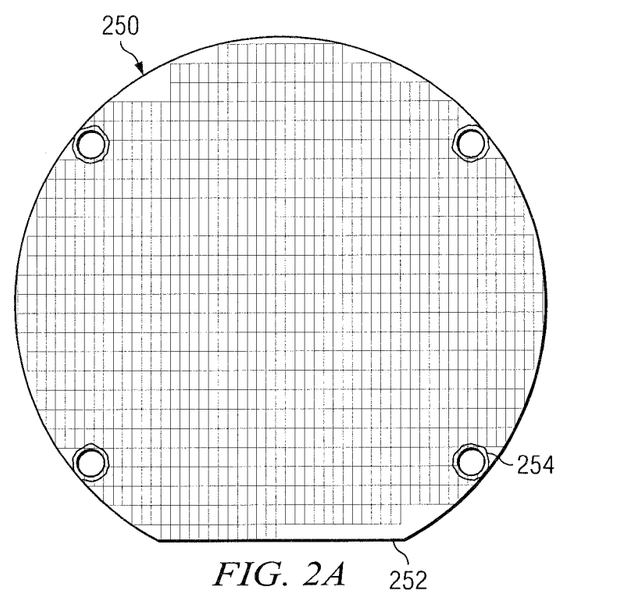
FIG. 2A illustrates a high voltage scrap wafer removed from the device of FIGS. 1A and 1B.
Figure 2B:
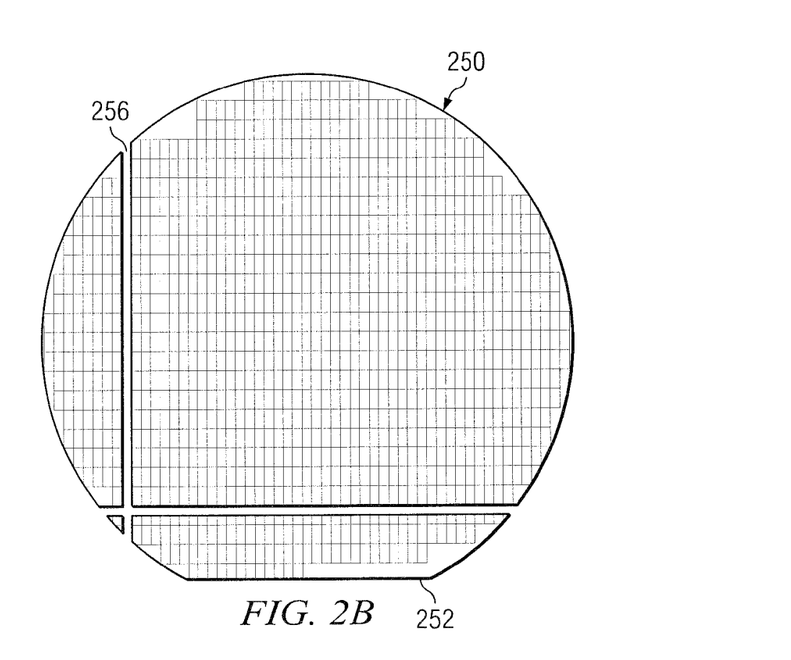
FIG. 2B illustrates a broken wafer removed from the device of FIGS. 1A and 1B.

The older style known plating holder 100, which is being replaced, is depicted in FIGS. 1A and 1B. Two wafers 250 exhibiting two types of exemplary damage from the known wafer holder 100 are depicted in FIGS. 2A and 2B. The known plating holder 100 uses two separate and disconnected pieces, including a base piece 110 and a top piece 120. The base piece 110 includes a wafer supporting surface 112 and a handle 114. A wafer 150 is seated on the wafer supporting surface 112. The top piece of the holder 100 includes four contact pins 122 protruding from a wafer facing surface. Wafers 150 and 250 include four contact points or openings through the patterned photo resist to the seed metal at points 152 (in FIG. 1A) and 254 (in FIG. 2A). The four metal contact pins 122 of the holder 100 engage with the four contact points 152 and 254 of the wafer 150 or 250, respectively. In addition, wiring to a power supply 124 is connected to the top piece 120 of the holder 100 for supplying current to the four holder metal contact pins 122. The base piece 110 and the top piece 120 are clamped together with four clamps 140 around a circumference of the holder 100. The four clamps 140 correspond in location to the four metal contact pins 122.

Metal electroplating is accomplished by delivering current to the metallized contact points 152 and 254 of a wafer surface (seed metal) through the four contact pins 122, acting as conductors pressed against the contact points of the wafer. In order to make the necessary contact, the metal pins 122 of the holder top piece 120 must be aligned with the four contact points 152 of the wafer after the wafer has been placed in the base piece 112 of the holder 100. This wafer opening/holder pin alignment must be done while clamping the four clamps 140 of the holder top piece 120 with the base piece 110 of the holder 100. The top piece 120 is clamped to the bottom piece 110 each time a wafer 150 is loaded in the holder 100. An operator must visually align the contact pins 122 of the top piece 120 with the contact points 152 of the wafer 150 held in the bottom piece 112. When trying to clamp the holder top piece 120 to the bottom piece 110, visual line of sight is impaired, causing holder pin 122 to wafer 150 contact point 152 alignment challenges, which can lead to wafer damage and wafer scrap. If sufficiently good contact is not established between the holder contact pins 122 and the wafer contact points 152, the wafer 150 must be scrapped because a power supply cannot reach the correct voltage to deliver the required set-point current to the wafer. This type of scrap is referred to as high voltage or reverse plating scrap because arcing occurs between the wafer seed metal openings 152 and the holder metal pins 122, resulting in wafer seed metal damage. When this high-voltage arcing, or reverse voltage bias occurs, the seed metal is plated to the holder's metal pins 122 and not the wafer.

An additional type of scrap occurs because the pressure between the holder contact pins 122 and the contact points 152 of the wafer 150 can result in wafer breakage.

FIGS. 2A and 2B illustrate high voltage scrap wafers and broken wafers 250, respectively. The high voltage scrap shown in FIG. 2A resulted from poor pin placement and/or alignment between a known four-pin holder and the four wafer 250 contact points 254. Pins were seated on the photo resist rather than the metallized contact point (wafer seed metal) or opening of the wafer, resulting in the high voltage scrap.

FIG. 2B depicts a broken wafer resulting from excessive stress transfer over the short distance between adjacent pins on the four-pin holder. The four-pin holder excessively stresses the wafer 250 due to pressure from the four contact pins (not shown, but see FIGS. 1A and 1B) on the contact points 254 of the wafer. The holder induced stress can cause breaks between adjacent contact points 254 on the wafer as depicted in FIG. 2B. When the contact pins of the holder press on the wafer contact points, they tend to break the wafer in a straight line 256 from one wafer contact point 254 to the adjacent wafer contact point.

High voltage scrap is caused by the holder pins not being aligned with the wafer contact points 254 on the wafer 250. When the holder metal pins are not seated directly on the wafer contact points, good contact to the wafer is lost for current delivery to the wafer. Proper contact is lost when the misaligned holder pins make contact with the wafer contact points 254. When this occurs, there will be photo resist between the metal pins 122 of the holder 100 top piece 120 and the wafer contact points 254, instead of making contact with the bare copper seed metal. This photo resist acts as an insulator and forces the power supply to drive up the voltage to deliver the proper current to the wafer. During the process of driving up the voltage, in an attempt to deliver the proper current through the photo resist, there occurs what is called High Voltage scrap.

In the art, and in order to avoid generating high voltage scrap and wafer breakage, instead of reducing the number of pin contacts with the wafer, holder manufacturers are increasing the number of pin contacts with the wafer. As an example, E&G Partners has a tool that uses 50 pin contacts. Semitool uses a patented holder that makes continuous contact with the entire circumference of the wafer.

There continues to be a need for improved plating that avoids wafer breakage and wafer scrap.

BRIEF SUMMARY

An embodiment is directed to a wafer holder.

The wafer holder includes a base and a lid hingedly connected to the base. The base includes a rotatable wafer support. The lid includes a universal frame and an interchangeable pin holder attachment spaced inwardly from the frame, the pin holder attachment having a wafer-facing surface and only two contact pins protruding from the wafer-facing surface. A single hinge pivotally connects the lid to the base, the hinge primarily aligning the two contact pins with two corresponding contact points on a wafer when the lid is closed against the base.

Another embodiment is directed to a method of holding a wafer for plating.

The method includes connecting, with a hinge, a lid component to a base component of the holder, the lid comprising a universal frame and an interchangeable pin holder attachment spaced inwardly from the frame, the pin holder attachment comprising only two wafer plating contact pins positioned diagonally opposite each other from a wafer facing surface; positioning a wafer in the base component of the holder, the wafer having only two plating contact locations; manually aligning the two wafer plating contact pins with the two plating contact locations upon rotating the lid about the hinge toward the base; and securing the lid to the base at a location diagonally opposing the hinged connection.

Additional embodiments of the disclosure will be set forth in part in the description which follows, and in part will be obvious from the description, or may be learned by practice of the present disclosure. The embodiments of the disclosure will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The invention is best understood from the following detailed description when read with the accompanying FIGURES. It is emphasized that in accordance with the standard practice in the semiconductor industry, various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

According to embodiments, the exemplary wafer holder includes a hinge connecting top and bottom pieces of the holder in a clam shell design. A semiconductor wafer is placed on the bottom piece. The number of contact pins extending from the top piece of the holder has been reduced from four to two. When the clam shell is closed, these pins contact the semiconductor wafer on a diagonal across the wafer. During the plating process, these pins are used to deliver electrical current to wafer seed metal. The holder containing the wafer can be used in conjunction with conventional plating equipment and standard plating processes.

The exemplary wafer holder increases the pin-to-pin spacing (thereby reducing stress on a wafer) by positioning the two pins in a diagonal configuration rather than in a four-adjacent pin-to-pin configuration. The two-pin configuration improves both on-wafer pin placement/alignment control and pin-to-pin spacing. The exemplary holder can reduce high voltage wafer scrap and wafer breakage. The exemplary holder potentially will reduce the number of die affected by electrical short defects and therefore may increase yield by 0.2%. An additional yield increase (0.15%) can be realized by uncovering die previously lost under two of the wafer openings that will be eliminated in the patterned photo resist when the number of pins is reduced from four to two.

Reference will now be made in detail to the exemplary embodiments of the present disclosure, an example of which is illustrated in the accompanying drawings. Wherever possible, the same reference numbers will be used throughout the drawings to refer to the same or like parts.

In the following description, reference is made to the accompanying drawings that form a part thereof, and in which are shown by way of illustration specific exemplary embodiments which may be practiced. These embodiments are described in sufficient detail to enable those skilled in the art to practice the embodiments, and it is to be understood that other embodiments may be utilized and that changes may be made without departing from the scope of the invention. The following description is, therefore, merely exemplary.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Figure 3A:
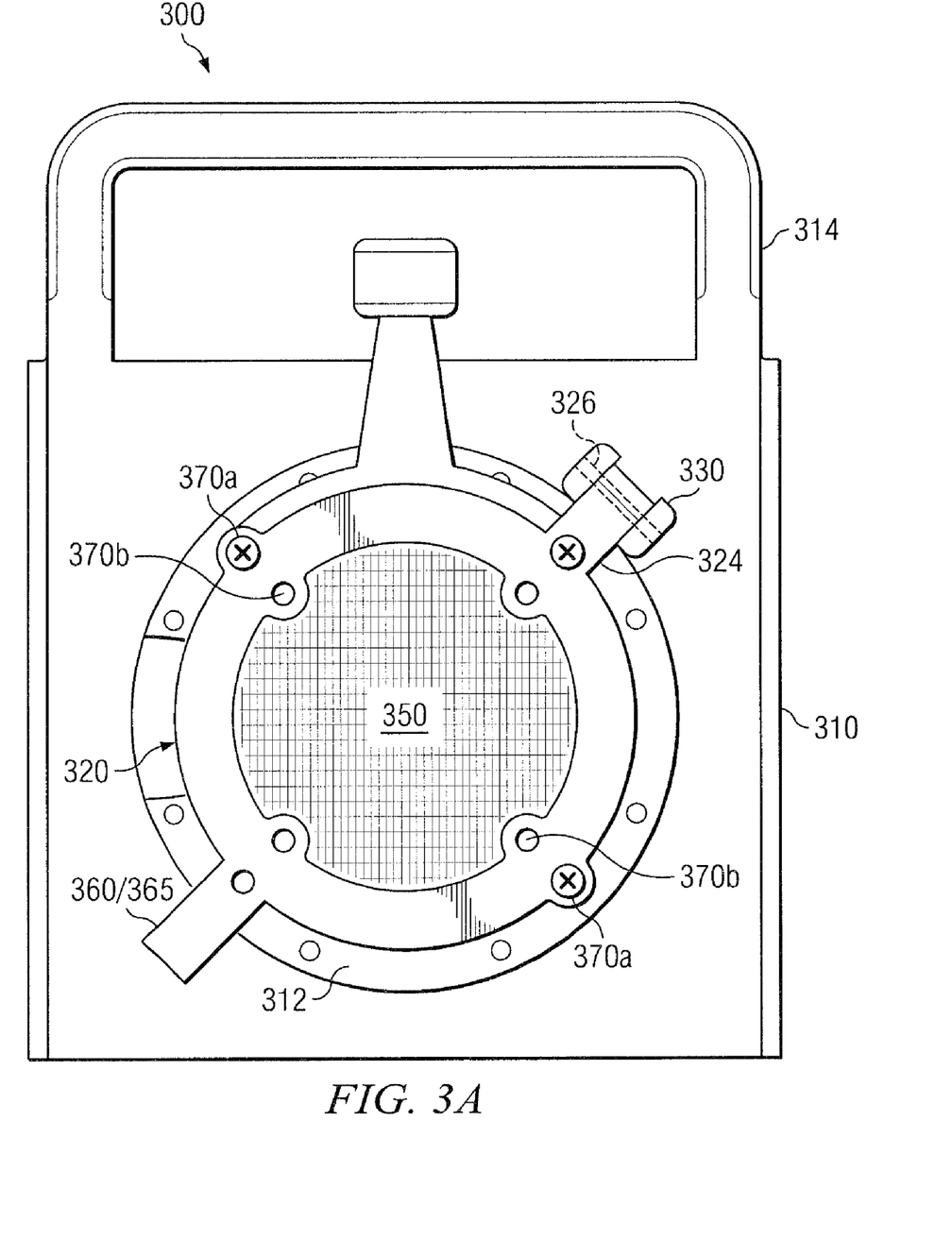
FIG. 3A is a diagram illustrating an exemplary clam shell two-pin wafer holder in a closed position according to certain embodiments.
Figure 3B:
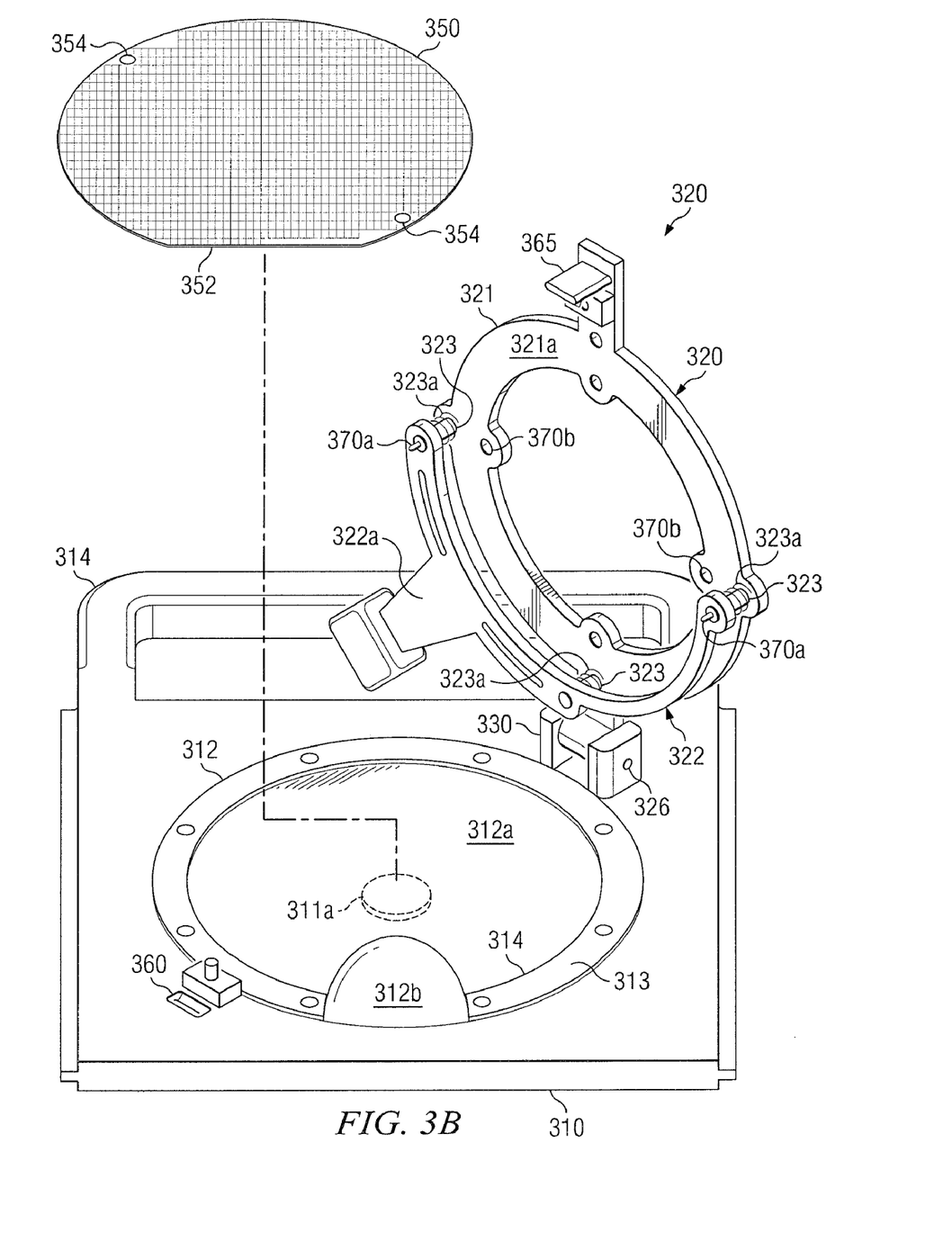
FIG. 3B is a diagram illustrating an exemplary clam shell two-pin wafer holder in an open position according to certain embodiments.
Figure 3C:
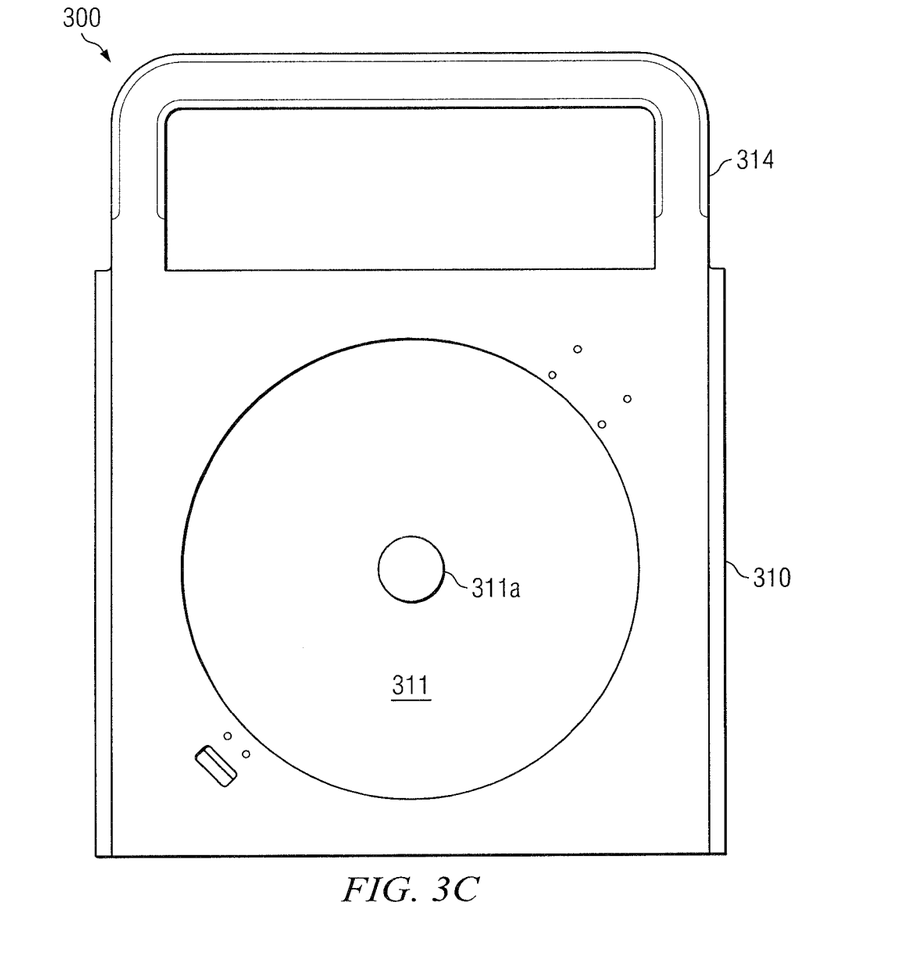
FIG. 3C is a diagram illustrating an exemplary clam shell two-pin wafer holder without additional components.
Figure 3D:
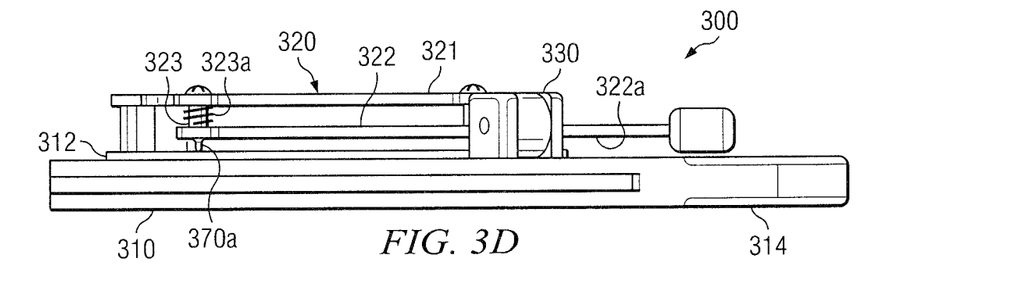
FIG. 3D is a side view of the exemplary clam shell two-pin wafer holder base adjacent a hinge.

FIGS. 3A and 3B are diagrams illustrating a wafer holder 300 in a clam shell configuration according to exemplary embodiments herein. FIGS. 3C and 3D are diagrams illustrating additional details of the clam shell wafer holder 300 according to exemplary embodiments herein. More specifically, FIG. 3A depicts the clam shell wafer holder 300 in a closed position and FIG. 3B depicts the clam shell wafer holder 300 in an open position. It should be readily apparent to those of ordinary skill in the art that the clam shell wafer holder 300 illustrated in FIGS. 3A and 3B represents a generalized illustration and that other components can be added or existing components may be removed or modified. The clam shell wafer holder 300 can include a base 310 and lid 320 pivotally connected to the base 310 by a hinge 330. A wafer 350 can be contained within the holder 300.

In exemplary embodiments, and as shown most clearly in FIG. 3A, the wafer 350 can be one of a six-inch wafer or an eight-inch wafer as known in the art. However, the size of the wafer as depicted and discussed is not intended to limit the scope of the disclosure, and any suitable size wafer can be used herein. The wafer 350 can be generally circular in shape and include a wafer bottom or notch/flat area 352. The wafer 350 can include only two wafer contact points 354 thereon. The two contact points 354 are formed by an opening in a patterned photoresist layer (not shown) on a surface of the wafer, the opening revealing a seed metal layer as the contact point 354.

Referring collectively to FIGS. 3A, 3B, 3C and 3D, base 310 of the holder 300 includes a rotatable disc-shaped wafer support 312 to hold the wafer 350 thereon, and handle 314 or peripheral configurations to assist in accommodating and managing the wafer holder in a hood (not shown) as known in the art. The base 310 can include a recessed cavity 311. The recessed cavity 311 can be of a size to accommodate the rotatable wafer support 312, and can include a centrally located dimple 311a, about which the wafer support can rotate. The rotatable wafer support 312 can include a wafer bearing surface 312a. The rotatable wafer support 312 can seat within the recessed cavity 311 of the base 310, yet accommodate varying sizes of wafers 350 on the wafer bearing surface 312a.

As depicted in FIG. 3B, the wafer support 312 can include an outer rim 313 and a wafer depth recess 314 interior of the outer rim 313. The outer rim 313 can be sized to a width that will correspondingly define a diameter of the wafer depth recess 314. For example, an outer rim 313 of a first width can define a wafer depth recess 314 and wafer bearing surface 312a suitable for accommodating an 8 inch wafer. Likewise, an outer rim 313 of a second width can define a wafer depth recess 314 and wafer bearing surface 312a diameter suitable for accommodating a 6 inch wafer. In each instance, the wafer support 312 can seat within the universally sized cavity 311 of the base 310. In addition, the wafer bearing surface 312a can include an access recess 312b. The access recess 312b can be positioned at a perimeter of the wafer bearing surface 312a and to a depth sufficient to enable extraction (e.g. lifting) of the wafer 350 from the wafer bearing surface 312a of the wafer support 312. The rotatable wafer support 312 can rotate within the cavity 311 of the base 310. As will be appreciated in the following, such mobility can enhance alignment of contact pins 370 with the wafer contacts 354 of the wafer 350 seated on the wafer bearing surface 312a.

Figure 5:
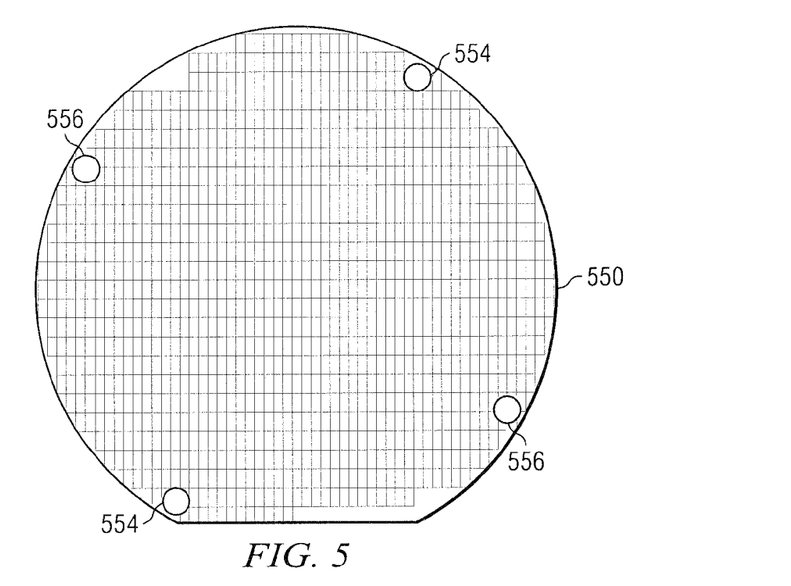
FIG. 5 is a diagram illustrating pin positions in an exemplary clam shell wafer holder and relative to a known wafer holder according to certain embodiments.

Because the wafer 350 and rotatable wafer support 312 in the holder base 310 are circular in shape, various positions around the circumference of the rotatable wafer holder 312 can be conveniently characterized to correspond to hour markings of a clock, for purposes of description, and as further depicted in FIG. 5. For example, positions around a circumference of the wafer 350 or the rotatable wafer holder 312 of the holder 300 can correspond to the hours of 1 to 12 on a clock face, with a 6 o'clock position being at the bottom of the figure and a 12 o'clock position at the top. When a wafer 350 is positioned on the rotatable wafer holder 312, the wafer bottom or notch/flat 352 located at the 6 o'clock position can be easily rotated to any clock position.

It will be appreciated that there are no markings actually provided on the wafer holder 312, wafer bearing surface 312a, or wafer 350, and that reference to any particular position is for ease of understanding placement of various components in the exemplary embodiments.

The base 310 can further include the hinge 330 and a hole 360 of a clamping mechanism 360/365. The hinge 330 can be integrally formed with the base 310. The base 310 contains the hole 360 through which a leg 365 on the lid 320 passes to lock the clamping mechanism 360/365. Further, the hinge 330 can be positioned at a 1 o'clock position as depicted in FIGS. 3A and 3B, with the hole 360 of the clamping mechanism positioned at a 7 o'clock position. The hole 360 can therefore be 180 degrees apart from (and diagonally opposed to) the hinge 330 in the exemplary embodiments. It will be appreciated that the hinge 330 can be positioned at virtually any location around a circumference of the wafer holder 312 with the hole 360 always positioned diagonally opposite, or 180 degrees apart from the hinge 330.

As depicted in the figures, only one hinge 330 and only one clamping mechanism 360/365 are provided in the exemplary configuration.

The lid 320 can include a frame 321 and a pin holder attachment 322. The frame 321 can include an inner or wafer facing surface 321a, a hinge interconnect 324 and the leg 365. The hinge interconnect 324 can be integrally formed on the frame 321 and can be further connected to the hinge 330 of the base 310. In order to secure the hinge interconnect 324 to the base hinge 330, a shaft 326 can be inserted through intersecting openings in each of the hinge interconnect 324 and hinge 330. The leg 365 can be connected to or integrally formed on the frame 321. Each of the leg 365 and hinge interconnect 324 can be diagonally opposed, i.e. 180 degrees apart, relative to the 360 degree circumference of the frame 321. The leg 365 can have a configuration suitable for locking with or unlocking from the hole 360 of the base 310 when the lid 320 is closed against the base 310 as in FIG. 3A.

The frame 321 of lid 320 can have a circumference substantially corresponding to that of the wafer holder 312 of the base 310. As depicted in the figures, the frame 321 can be formed as a ring such that an opening interior of the ring can enable visual observation of a wafer 350 when the lid 320 is closed against the base 310. The frame 321 further includes shafts 323 positioned to protrude in a wafer facing direction from the frame 321. As depicted, three shafts 323 can slide within corresponding apertures (not shown) of the frame 321. The shafts 323 further connect to the pin holder attachment 322 as shown. The shafts 323 effectively space the pin holder attachment 322 from the frame 321. A biased spring 323a can surround each of the shafts 323 between facing surfaces of the frame 321 and the pin holder attachment 322. With the biased springs 323a, the pin holder attachment 322 can flex or yield when the lid 320 is closed against the base 310, thereby enabling uniform pressure from contact pins at their respective contact points on the wafer 350. The shafts 323 can further encase all device wiring and protect the encased wiring from environmental effects.

The pin holder attachment 322 can include a wafer facing surface 322a. Contact pins 370 can be integrally attached on the wafer facing surface 322a thereof. The contact pins can be positioned at only two of the shafts 323 as shown.

Contact pins 370 can be integrally provided on the wafer facing surface 322a of the pin holder attachment 322. The contact pins 370 can be metal pins. In response to an application of electrical current and the presence of a plating material, the contact pins 370 can conduct current to plate metal to a contacted surface of the wafer. Each pin holder attachment 322 can include only two contact pins 370 compared with the four contact pins known in the art. The two contact pins 370 can be positioned diagonally across (e.g. 180 degrees) from each other on the wafer facing surface 322a of the pin holder attachment 322. The two-pin configuration can be oriented at any location around a 360 degree circumference of the pin holder attachment 322. By way of example, one pin 370 can be positioned at a 10 o'clock position on the wafer facing surface 322a of the pin holder attachment 322 and the diagonally opposed pin 370 can be positioned at a 4 o'clock position on the wafer facing surface 322a of the pin holder attachment 322. Similarly, one pin 370 can be positioned at a 1 o'clock position and the diagonally opposed pin 370 can be positioned at a 7 o'clock position on the wafer facing surface 322a of the pin holder attachment 322. In any configuration, only two contact pins 370 touch the wafer 350 to deliver electrical current needed for plating metal to the wafer. More specifically, only two contact pins 370 touch respective contact points 354 (254 or 554) of the wafer 350 (250 or 550), respectively.

As further depicted in FIG. 3B, the lid 320 can be configured to accommodate two different sizes pin holder attachments 322, and thereby two sets of pins 370. For example, for plating a 6-inch wafer 350 provided on the wafer supporting surface 312, the pin holder attachment 322 can incorporate two pins positioned at 370b as shown. The two pins 370b can directly align with and engage corresponding contact points 354 on the 6-inch wafer. For plating an 8-inch wafer 350 provided on the wafer supporting surface 312, the pin holder attachment 322 can incorporate two pins 370a positioned as shown. The two pins 370a can directly align with and engage corresponding contact points 354 on the 8-inch wafer. It will be appreciated that the pins 370a, 370b are therefore provided according to a wafer size. In any given embodiment, however, only two contact pins 370 are used, either the inner pair 370b or the outer pair 370a. The remaining contact pins are removed if not in use. Interchanging the pin holder attachment 322 with the frame 321 of the lid 320 can be accomplished by releasing and tightening the shafts 323. Each shaft 323 can include a threaded tip (not shown) which mates with a correspondingly threaded opening in the pin holder attachment 322. In addition, contact pin 370 locations can be rotated by 90 degrees for each of the two pins 370 and the hinge 330 can be located anywhere in a 360 degree circle on the holder 300 as will be described further in the following.

As described above, the wafer 350 can include two contact points 354 thereon, for either a 6 inch wafer or an 8 inch wafer. Upon closing the lid 320 against the wafer 350 placed on the rotatable wafer support 312 seated in the base 310, the two contact pins 370 engage with the two contact points 354 on the wafer 350. Alignment can be further perfected by rotating the wafer support 312, and thereby the wafer 350, such that the wafer contact points 354 are correctly aligned with the two contact pins 370. Engagement of the contact pins 370 with the contact points 354 can enable plating current to deliver blanket seed metal and/or plating material to the wafer 350. Contact pressure can be spread in a diagonal fashion across the wafer 350 rather than between adjacent pins as occurs with the known four-contact pin configurations.

FIG. 3D is provided to depict contact of the contact pin 370 against the corresponding wafer contact point (not visible from the side view) of the wafer seated within the support plate 312. The hinge 330 location is provided for perspective.

As also apparent from FIGS. 3A and 3B, contact pins 370 can be spaced from the hinge 330 and catch 360/latch 365 locations as shown. Accordingly, when the lid 320 is closed against the base 310, spacing of the pins 370 from the hinge 330 and clamping mechanism 360/365 can assist in a visual check that the pins 370 are positioned to engage the wafer contact points 354. In addition to ease of visual alignment, accuracy of alignment of the pins 370 to the wafer contact points 354 is aided by the constant location and stability of the hinge 330 with the hinge interconnect 324 and only one clamping mechanism 360/365 to secure the lid 320 to the base 310. In other words, the hinge 330 and hinge interconnect 324 configuration joins the lid 320 and the base 310, creating a one-piece clam shell holder. This simplifies a previously complicated alignment and mating process, resulting in less wafer breakage and less wafer scrap. This alignment check was very difficult with the four-pin holders in the known art because an operator could not clearly see all pins during the manual alignment and clamping together of the two distinct holder pieces.

Orientation of the pins can also be accomplished to accommodate more advanced CMOS technologies that re-orient the crystal direction, which cleaves along 45 degrees on certain substrate types. Accordingly, there can be a 45-degree offset between the pins and the crystal direction. Further, due to constant and reproducible location of the pins, accuracy can be obtained in wafer contact.

Figure 4:
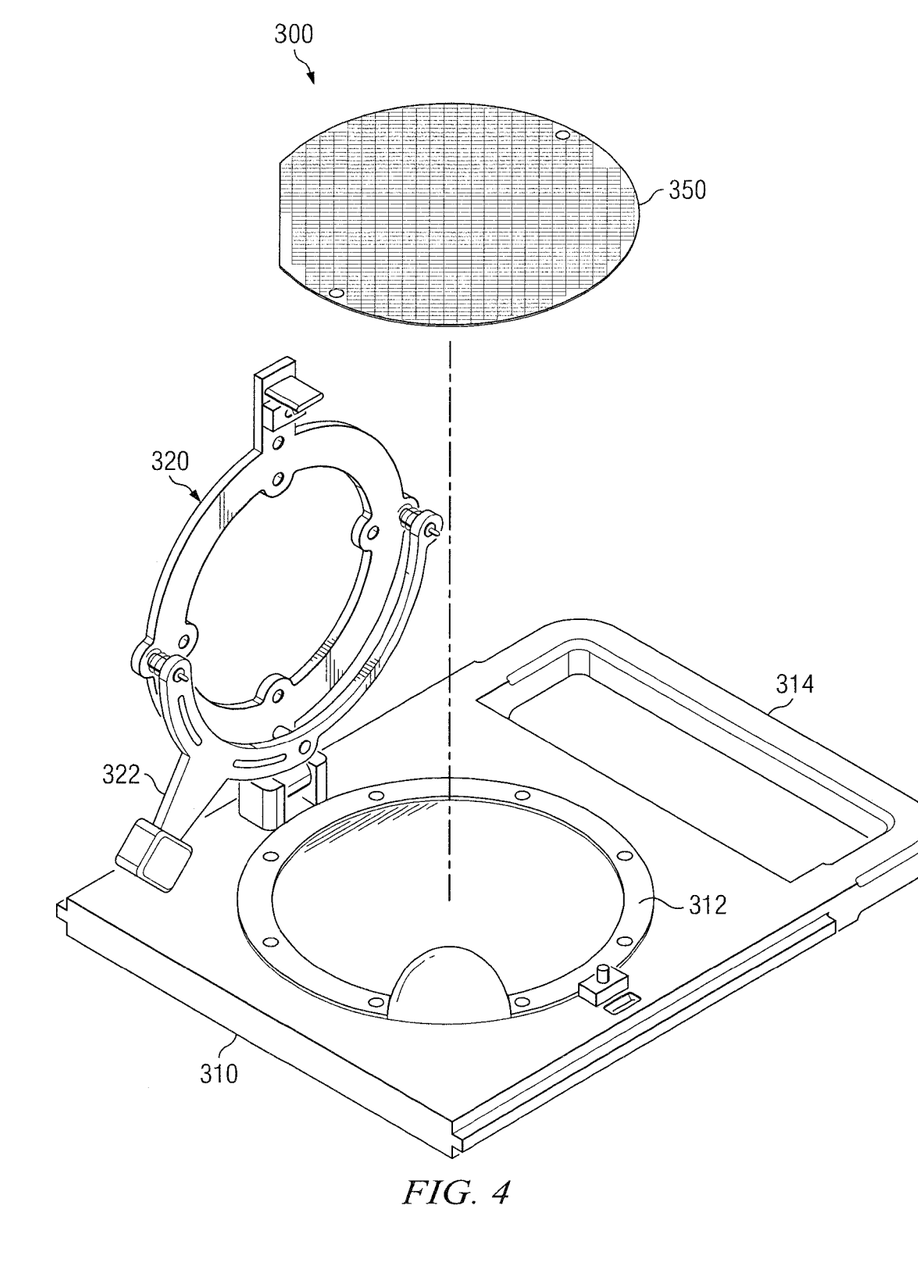
FIG. 4 is a diagram illustrating an exemplary clam shell wafer holder having a relocated hinge from the 1 o'clock to the 9 o'clock position according to certain embodiments.

FIG. 4 is a diagram illustrating an exemplary clam shell wafer holder 300 having a relocated hinge according to certain embodiments It should be readily apparent to those of ordinary skill in the art that the clam shell wafer holder 300 illustrated in FIG. 4 represents a generalized illustration and that other components can be added or existing components may be removed or modified. The clam shell wafer holder 300 can include components as described above in connection with FIGS. 3A-3D. However, while FIGS. 3A and 3B depict the holder 300 hinged at a 1 o'clock position, FIG. 4 is provided to illustrate that a holder 300 can be configured to be hinged at a 9 o'clock position with a clamping mechanism 360/365 hinged at a 3 o'clock position. By way of example, the holder 300 can plate 6-inch wafers and can plate 8-inch wafers. All other components are consistent with that of FIGS. 3A through 3D and will be appreciated in full by one of skill in the art.

FIG. 5 is a schematic diagram illustrating pin positions in an exemplary wafer holder and relative to a known wafer holder according to certain embodiments.

As depicted in FIG. 5, a wafer 550 can include two contact points 554 therein. The contact points 554 can be positioned at about a 1 o'clock position and a 7 o'clock position on an exposed surface of the wafer 550. Also depicted in FIG. 5 are the two contact points 556 which are used in the known plating devices and which are eliminated in each exemplary embodiment herein. By using only two contact points 554, a portion of the wafer can be recovered for plating, forming die, and ultimate sale. In other words, those locations on the wafer surface that were previously utilized as contact points can now be cut into usable die. It is expected that die recovery can increase by about 0.15% per wafer.

Figure 6:
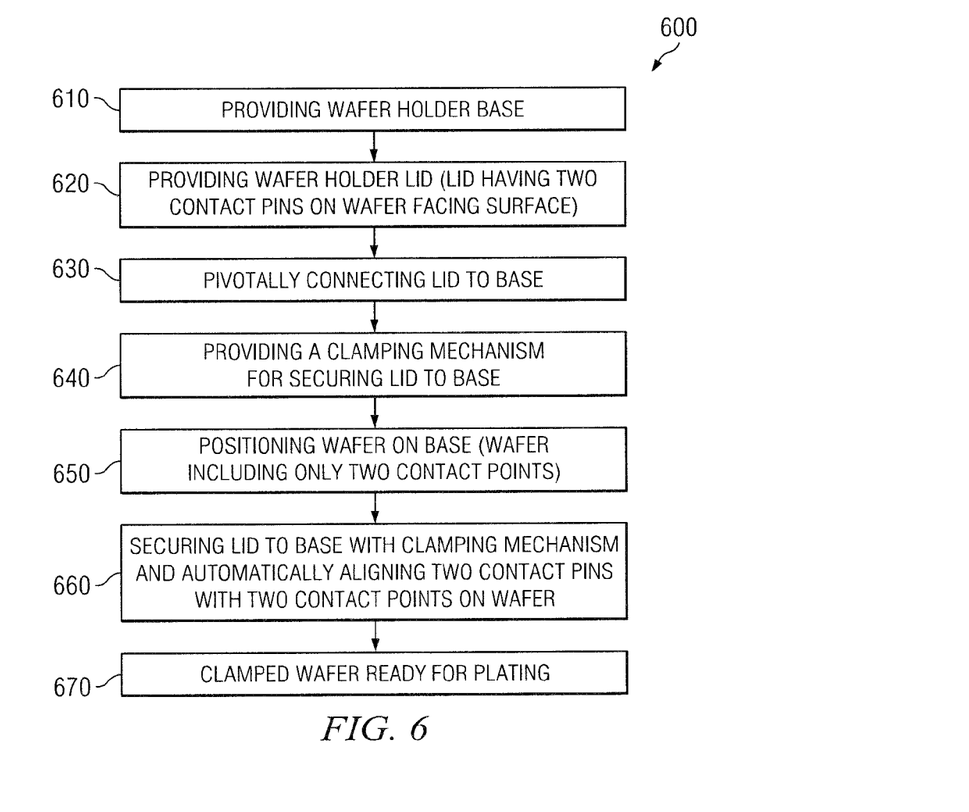
FIG. 6 is a flow chart depicting a method of holding a wafer for plating according to certain embodiments.

FIG. 6 is a flow diagram illustrating a method 600 of holding a wafer for plating, consistent with embodiments of the present disclosure. It should be readily apparent to those skilled in the art that FIG. 6 is exemplary and that other steps can be added or existing steps can be removed or modified without departing from the scope of the exemplary embodiments.

Method 600 begins with providing a base at 610. The base can be provided with a wafer supporting surface and a hinge. The hinge can be positioned at a periphery of the wafer holder. The hinge can further be positioned at any location along a 360 degree periphery of the wafer holder.

A lid can be provided at 620. The lid can include a hinge interconnect, a wafer facing surface and two contact pins formed in the wafer facing surface, the contact pins positioned diagonally opposite from each other. The two contact pins can further be positioned diagonally opposite from each other at any of 360 degrees of the wafer holder.

At 630, the lid can be pivotally connected to the base. The pivotal connection can be by means of the hinge of the base and the hinge interconnect of the lid.

At 640, a clamping mechanism can be provided for securing the lid to the base. The clamping mechanism can include a hole formed in the base and a leg formed on the lid. In the method of FIG. 6, only one clamping mechanism is provided.

At 650, a wafer can be positioned on the rotatable wafer support surface. The wafer can include two contact points on an exposed surface. The two contact points on the wafer comprise plating contact points for current delivery to the wafer.

At 660, the lid can be secured to the base with the clamping mechanism allowing manual alignment of the two holder contact pins with the two contact points on the wafer.

The method can conclude at 670 with a clamped wafer ready for plating.

In the method of FIG. 6, the contact pins can be positioned to engage contact points of a 6-inch wafer. The contact holder pins can be repositioned to engage contact points of an 8-inch wafer.

In the method of FIG. 6, the hinge can be positioned at a 1 o'clock position and the contact pins can be positioned at a 4 o'clock position and a 10 o'clock position with respect to a clock configuration. Further, in the method of FIG. 6, the hinge can be positioned at a 9 o'clock position and the contact pins can be positioned at a 1 o'clock position and a 7 o'clock position with respect to a clock configuration.

Certain advantages can be obtained by the exemplary embodiments disclosed herein. These advantages include increased die recovery because of the reduction of the number of metal pads for the holder pins to rest on thereby uncovering previously lost die under these pads; reduced electrical shorts near the current delivery point; less stress to the wafer resulting in decreased wafer breakage; reduced high voltage on the wafer resulting in substantially less scrap; better control of pin positioning; and reduced ergonomic issues.

The improved ergonomics is due to the use of a hinge in a clam shell holder design rather than using discrete top and bottom pieces which must be manually maneuvered, aligned and interconnected before each use.

There can be 70% less high voltage scrap and broken wafers with the two-pin holder than with the four-pin holder. The four-pin holder breaks more wafers than the two-pin holder because it puts more stress over shorter distance between adjacent openings on the wafer. Without being bound by theory, it is believed that there may also be a silicon crystalline structure component in the reduced wafer breakage on the two-pin holder because the crystal orientation may be more favorable to the stresses induced by the two pin holder.

In addition, wafer die slice sites will encounter reduced saw blade change-outs and therefore increased die slice through-put. Cutting through thick plated metal at the wafer's contact point will dull the cutting blades. Less wafer contact points to cut through will reduce the frequency of dull blades.

The die slice sites can also benefit from reduced saw blade "chatter" and the resulting die damage in the areas of the contact points on the wafer because these areas are difficult to slice. The slice difficulty stems from the fact that these wafer contact points receive copper, nickel and palladium plating, resulting in a much thicker metal deposit at the wafer opening, which is there only for metal pin placement and current delivery to the wafer for plating. By reducing the number of required wafer contact points from four to two, the number of die slice problems may be reduced by half.

Finally, recovery of the die previously buried under two of the eliminated contact points can result in a 0.2% increase in die yield.

Other embodiments of the present disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A wafer holder comprising:
   a base comprising a rotatable wafer support;
   a lid comprising a universal frame and an interchangeable pin holder attachment spaced outwardly from the frame, the pin holder attachment comprising a wafer-facing surface and only two contact pins protruding from the wafer-facing surface;
   a single hinge pivotally connecting the lid to the base, the hinge primarily aligning the two contact pins with two corresponding contact points on a wafer when the lid is closed against the base; and
   three shafts that space the pin holder attachment away from the frame.

2. The wafer holder of claim 1, wherein the pin holder attachment is biased away from the frame.

3. The wafer holder of claim 1, further comprising only one clamping mechanism securing the lid to the base.

4. The wafer holder of claim 1, wherein the two corresponding contact points on the wafer comprise plating contact points.

5. The wafer holder of claim 1, wherein the contact pins are positioned diagonally opposite from each other.

6. The wafer holder of claim 1, wherein the contact pins are positioned diagonally opposite from each other.

7. The wafer holder of claim 1, wherein the interchangeable pin holder attachment comprises contact pins positioned to engage contact points of a 6-inch semiconductor wafer.

8. The wafer holder of claim 1, wherein the interchangeable pin holder attachment comprises contact pins positioned to engage contact points of an 8-inch semiconductor wafer.

9. The wafer holder of claim 1, wherein the hinge is positioned at any location around a 360 degree periphery of the wafer holder.

10. The wafer holder of claim 1, wherein the hinge is positioned at a 1 o'clock position with the contact pins positioned at a 4 o'clock position and a 10 o'clock position with respect to a clock configuration.

11. The wafer holder of claim 1, wherein the hinge is positioned at a 9 o'clock position with the contact pins positioned at a 1 o'clock position and a 7 o'clock position with respect to a clock configuration.

12. A wafer holder comprising:
    a base comprising a rotatable wafer support;
    a lid comprising a universal frame and an interchangeable in holder attachment spaced outwardly from the frame, the in holder attachment comprising a wafer-facing surface and only two contact pins protruding from the wafer-facing surface;
    a single hinge pivotally connecting the lid to the base, the hinge primarily aligning the two contact pins with two corresponding contact points on a wafer when the lid is closed against the base; and
    only one clamping mechanism securing the lid to the base, wherein the clamping mechanism comprises a hole formed in the base and a leg formed in the frame, the clamping mechanism diagonally opposed to the single hinge.

13. A method of holding a wafer for plating, the method comprising:
    connecting, with a hinge, a lid component to a base component of the holder, the lid comprising a universal frame and an interchangeable pin holder attachment spaced inwardly from the frame, the pin holder attachment comprising only two wafer plating contact pins positioned diagonally opposite each other from a wafer facing surface;
    positioning a wafer in the base component of the holder, the wafer having only two plating contact locations;
    manually aligning the two wafer plating contact pins with the two plating contact locations upon rotating the lid about the hinge toward the base; and
    securing the lid to the base at a location diagonally opposing the hinged connection.

14. The method of claim 13, wherein securing the lid to the base involves a single clamping mechanism.

15. The method of claim 13, further positioning the two contact pins diagonally opposite from each other at any of 360 degrees of the wafer holder.

16. The method of claim 13, wherein the wafer plating contact pins are positioned to engage plating contact locations on one of a 6-inch wafer or an 8-inch wafer.

17. The method of claim 13, wherein the hinged connection is positioned at a 1 o'clock position and wherein the contact pins are positioned at a 4 o'clock position and a 10 o'clock position with respect to a clock configuration.

18. The method of claim 13, wherein the hinged connection is positioned at a 9 o'clock position and the contact pins are positioned at a 1 o'clock position and a 7 o'clock position with respect to a clock configuration.

19. The method of claim 13, wherein pin-to-pin spacing comprises a 180 degree separation around a circumference of the holder.

* * * * *